(12) United States Patent  (10) Patent No.: US 8,701,074 B2
Sripada et al.  (45) Date of Patent: *Apr. 15, 2014

(54) AUTOMATIC REDUCTION OF MODES OF ELECTRONIC CIRCUITS FOR TIMING ANALYSIS

(75) Inventors: Subramanyam Sripada, Hillsboro, OR (US); Cho Moon, San Diego, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/328,572

(22) Filed: Dec. 16, 2011

(65) Prior Publication Data

US 2012/0324410 A1 Dec. 20, 2012

Related U.S. Application Data

(63) Continuation-in-part of application No. 12/960,745, filed on Dec. 6, 2010, and a continuation-in-part of application No. 12/759,625, filed on Apr. 13, 2010, now Pat. No. 8,261,221.

(51) Int. Cl.
  *G06F 17/50* (2006.01)

(52) U.S. Cl.
  USPC ........... 716/134; 716/106; 716/107; 716/113; 716/136

(58) Field of Classification Search
  USPC ..................... 716/106–107, 113, 134, 136
  See application file for complete search history.

(56) References Cited

U.S. PATENT DOCUMENTS

| 5,528,511 | A | 6/1996 | Hasegawa |
| 6,308,306 | B1 | 10/2001 | Kaneko |
| 6,487,705 | B1 | 11/2002 | Roethig et al. |
| 6,718,304 | B1 | 4/2004 | Tachimori et al. |
| 7,019,622 | B2 | 3/2006 | Orr et al. |
| 7,284,219 | B1 | 10/2007 | Manaker, Jr. et al. |
| 7,292,227 | B2 | 11/2007 | Fukumoto et al. |
| 7,418,684 | B1 * | 8/2008 | Moon et al. .................. 716/113 |
| 7,698,674 | B2 | 4/2010 | Kalafala et al. |
| 7,739,098 | B2 * | 6/2010 | Kucukcakar et al. ........... 703/19 |
| 8,196,076 | B2 * | 6/2012 | Chander et al. ............... 716/108 |
| 8,209,648 | B1 * | 6/2012 | Ku et al. ....................... 716/108 |
| 2003/0229871 | A1 | 12/2003 | Nakae et al. |

(Continued)

OTHER PUBLICATIONS

United States Office Action, U.S. Appl. No. 13/025,075, Oct. 17, 2012, 12 pages.

(Continued)

*Primary Examiner* — Nghia Doan
(74) *Attorney, Agent, or Firm* — Fenwick & West LLP

(57) ABSTRACT

Modes of a circuit are merged together to reduce the number of modes. Subsets of modes are identified such that modes belonging to each subset are mergeable. A set of modes is mergeable if every pair of modes in the set is mergeable. Constraints of modes belonging to each pair of modes are compared to determine whether two modes are mergeable. To allow two modes to be merged, a constraint is transformed such that it affects the same paths in the merged mode and the first mode but excludes paths from the second mode. Determining whether two modes are mergeable may include verifying whether a clock in one mode blocks propagation of a clock in another mode and whether a value specified in a constraint in a mode is within specified tolerance of the value of a corresponding constraint in another mode.

24 Claims, 14 Drawing Sheets

(56) References Cited

U.S. PATENT DOCUMENTS

| | | | |
|---|---|---|---|
| 2004/0210861 A1 | 10/2004 | Kucukcakar et al. | |
| 2005/0017947 A1 | 1/2005 | Shahoian et al. | |
| 2006/0022536 A1 | 2/2006 | Fujii et al. | |
| 2006/0055515 A1 | 3/2006 | Yatsu et al. | |
| 2006/0157632 A1 | 7/2006 | Delson | |
| 2007/0046627 A1 | 3/2007 | Soh et al. | |
| 2007/0091063 A1 | 4/2007 | Nakamura et al. | |
| 2007/0216235 A1 | 9/2007 | Lee | |
| 2007/0234253 A1* | 10/2007 | Soreff et al. | 716/6 |
| 2008/0301598 A1 | 12/2008 | Gangadharan et al. | |
| 2009/0132984 A1 | 5/2009 | Chander et al. | |
| 2009/0326873 A1 | 12/2009 | Wang et al. | |

OTHER PUBLICATIONS

United States Office Action, U.S. Appl. No. 12/960,745, Oct. 12, 2012, 18 pages.

Das, S.K. et al., "The Automatic Generation of Merged-Mode Design Constraints," Fishtail, Texas Instruments, Jul. 29, 2009, 15 pages.

Gangadharan, S. et al., "Preserving the Intent of Timing Constraints", EDA Design Line, May 17, 2008, [Online] [Retrieved on Nov. 5, 2010] Retrieved from the Internet<URL:http://www.edadesignline.com/207800772?printableArticle=true>.

PCT International Search Report and Written Opinion, PCT Application No. PCT/US2011/032268, Oct. 25, 2011, 9 pages.

United States Office Action, U.S. Appl. No. 12/960,745, Apr. 9, 2012, 15 pages.

United States Office Action, U.S. Appl. No. 12/759,625, Jan. 20, 2012, 15 pages.

United States Office Action, U.S. Appl. No. 13/025,075, May 16, 2012, 10 pages.

United States Office Action, U.S. Appl. No. 12/960,745, Apr. 9, 2013, 21 pages.

* cited by examiner

Mode B1
    create_clock --name CLKA ...
    set_case_analysis 0 [mux1/S]
    set_multicycle_path 2 --from [FF1/CP]

Mode B2
    create_clock --name CLKB ...
    set_case_analysis 1 [mux1/S]

Mode B12 (not equivalent to modes B1 and B2)
    create_clock --name CLKA ...
    create_clock --name CLKB ...
    set_multicycle_path 2 -from [FF1/CP]

Mode B1'
    create_clock –name CLKA …
    set_case_analysis 0 [mux1/S]
    set_multicycle_path 2 *-from [get_clocks CLKA]*
        *–through [FF1/CP]*

Mode B2
    create_clock –name CLKB …
    set_case_analysis 1 [mux1/S]

Merged Mode B1'2
    create_clock –name CLKA …
    create_clock –name CLKB …
    set_multicycle_path 2 *-from [get_clocks CLKA]*
        *–through [FF1/CP]*

Mode P1
    create_clock --name CLKA ...
    set_multicycle_path 2 --from [FF1/CP]

Mode P2
    create_clock --name CLKA ...

Mode P12 (not equivalent to modes P1 and P2)
    create_clock --name CLKA ...
    set_multicycle_path 2 -from [get_clocks CLKA]
        --through [FF1/CP] --to [get_clocks CLKA]

AUTOMATIC REDUCTION OF MODES OF ELECTRONIC CIRCUITS FOR TIMING ANALYSIS

CROSS REFERENCE TO RELATED APPLICATIONS

This application is a continuation-in-part of U.S. application Ser. No. 12/960,745, filed Dec. 6, 2010, which is a continuation-in-part of U.S. application Ser. No. 12/759,625, filed Apr. 13, 2010, each of which is hereby incorporated by reference in its entirety.

FIELD OF THE INVENTION

This invention relates generally to electronic design automation (EDA) of circuits and in particular to automatic reduction of number of modes of electronic circuits for timing analysis, by merging modes.

BACKGROUND

Due to the large number of components in state of the art electronic circuits, most of their design and production is computer implemented. An important operation performed during design of electronic circuits is timing analysis that validates timing performance of an electronic design. For example, static timing analysis validates timing performance of a circuit design by checking possible paths for timing violations. Performing timing analysis for large electronic circuits can take significant time.

Furthermore, timing analysis is repeated multiple times for the same electronic design for various combinations of modes and corners. Semiconductor device parameters can vary with conditions such as fabrication process, operating temperature, and power supply voltage. A circuit fabricated using these processes may run slower or faster than specified due to variations in operating conditions or may even fail to function. Therefore timing analysis is performed for various operating conditions to make sure that the circuit performs as specified under these conditions. Such operating conditions for a circuit are modeled using corners that typically comprise a set of libraries characterized for process, voltage, and temperature variations.

The timing analysis of a circuit is also repeated for different operating modes, for example, normal operating mode, test mode, scan mode, reset mode and so on. For example, a circuit used in a computer operates in a stand-by mode when the computer is in a stand-by mode. Similarly, during testing phase, a circuit may be operated in a test mode. A mode is modeled using a unique set of clocks, input voltages, and timing constraints in similar operating conditions.

For performing timing analysis during implementation and sign-off of a circuit, designers may have to verify a large number of modes and corners. Each circuit design may have tens of modes and tens of corners or more. Since each mode should be verified for each corner condition, the total number of scenarios for which the design is verified is the product of the number of modes and number of corners. This results in the timing analysis being performed a large number of times resulting in high costs.

One way to handle the large number of scenarios resulting from multiple modes and corners is to merge the modes into a smaller set, for example, a single mode. Since timing analysis is performed for the combination of modes and corners, reduction in the number of modes reduces the total combinations of modes and corners by a much larger number. For example, if there are 10 modes and 10 corners, the total number of scenarios is 10×10=100. However if the 10 modes were combined to a single mode, the total number of scenarios is reduced to 1×10=10 which is a 90% reduction in the number of scenarios to be verified.

Conventionally, modes are merged manually by designers. However, due to the complexity of constraints associated with circuit designs, the generation of merged modes is difficult to handle manually. Since the number of timing constraints for a given netlist can be large, manual merging of modes can be error prone and have prohibitive costs. For example, a circuit could have millions of constraints and manually determining which modes can be merged together and then merging them may not be practically feasible.

SUMMARY

The above and other issues are addressed by a computer-implemented method, computer system, and computer program product for determining which modes of an electronic circuit can be merged together so as to reduce the total number of modes. Information describing a plurality of modes of a circuit is received. A mode comparison module compares pairs of modes from the plurality of modes to determine which pairs of modes are mergeable. In one approach, determining whether a pair of modes is mergeable includes selecting a constraint from a mode and determining whether a corresponding constraint exists in the other mode. If no corresponding constraint is found in the other mode, the mode comparison module identifies paths to which the constraint is applicable and determines whether the identified paths are inactive in the second mode. In some embodiments, if the paths are determined to be inactive in the second mode, the constraint may be transformed to limit its applicability to a subset of paths in order to allow the modes to be merged. Examples of constraints in embodiments include timing exceptions, for example, timing exceptions specifying false paths, multicycle paths, or minimum/maximum delay paths. Subsets of modes are identified such that each pair of modes in the subset of modes is mergeable. Each identified subset of modes is mergeable into a single node.

In an embodiment, transforming a constraint comprises specifying a source of a path, a destination of a path, or both source and destination of a path to which the constraint is applicable. Embodiments verify whether a clock in one mode blocks propagation of a clock in another mode. If a clock is identified that blocks propagation of a clock in another mode, the two modes are determined to be not mergeable. Embodiments verify whether a value specified in a constraint is within a pre-specified tolerance of a corresponding value in a corresponding constraint of another mode. If the value is determined to be outside the pre-specified tolerance of the value specified in the constraint of the other mode, the two modes are determined to be not mergeable.

The features and advantages described in this summary and the following detailed description are not all-inclusive, nor are they required for all embodiments. Many additional features and advantages will be apparent to one of ordinary skill in the art in view of the drawings, specification, and claims hereof.

The Figures (FIGS.) and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures

DETAILED DESCRIPTION

Circuit designers perform timing analysis of hundreds of combinations of modes and corners for implementation and sign-off of circuit designs. An electronic circuit can be represented as a circuit configuration comprising a description of the components of the circuit and the connections between the circuits specified as netlists and a representation of the timing constraints for the circuit. Each mode of a given circuit can be modeled as a set of constraints for the given set of netlists. Multiple modes are merged into smaller set of modes, for example, a set of one mode to reduce the processing costs associated with analysis of the circuit design.

Embodiments determine whether modes of an electronic circuit can be merged together. Two modes that can be merged are also called mergeable modes. A set of modes is determined to be mergeable if every pair of modes in the set is mergeable. Sets of modes determined to be mergeable are automatically merged to reduce the overall number of modes that are further analyzed. Automatic merging of the modes also gives high confidence in the correctness of the merged modes. As a result, the merged modes can be used for the implementation phase of the design as well as the final sign-off phase. Furthermore, automatic merging of merged modes is less expensive and efficient to perform compared to manual processing.

Figure 1:
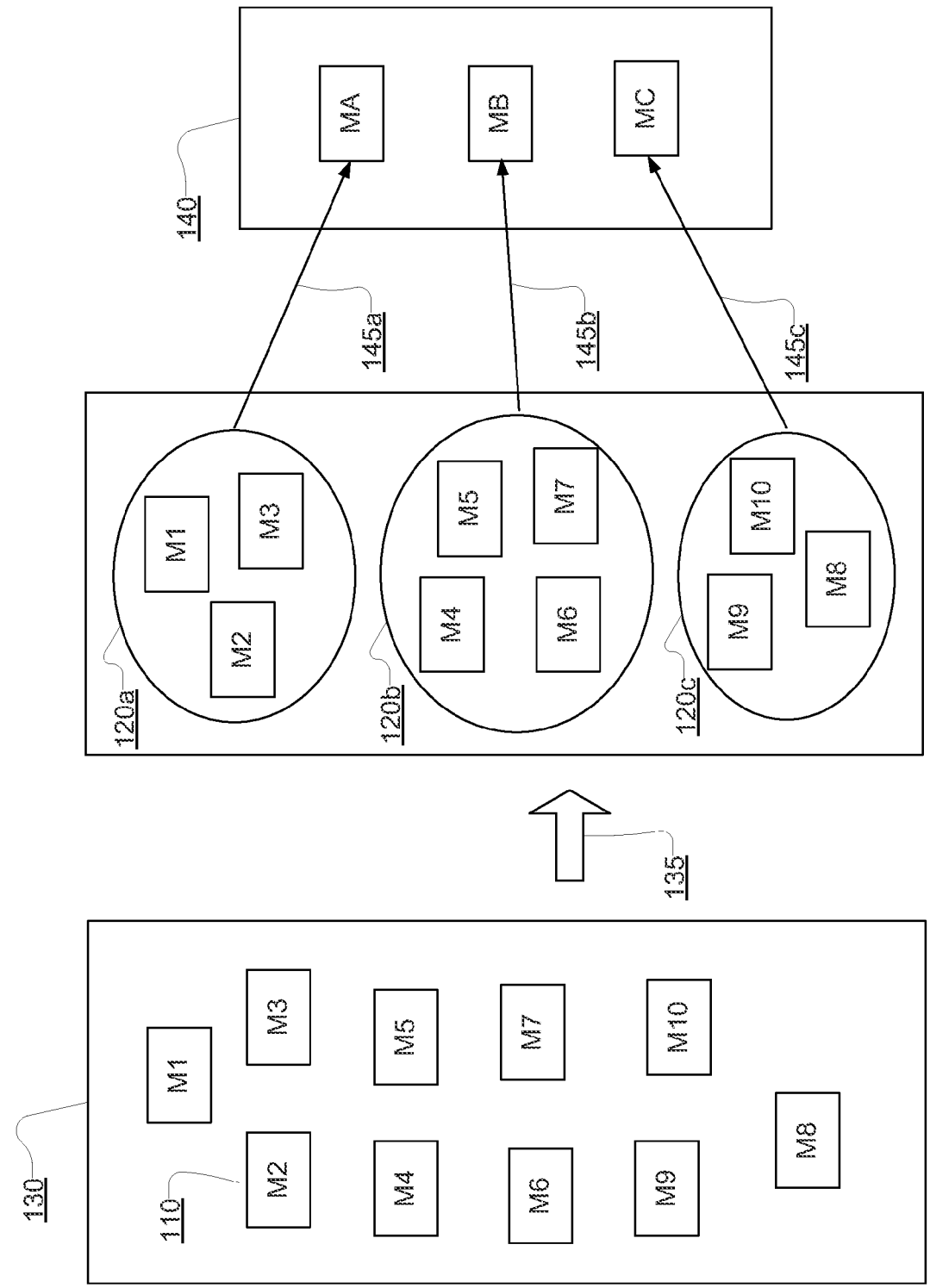
FIG. 1 illustrates a process of merging modes to reduce the total number of modes, in accordance with an embodiment.

FIG. 1 illustrates the overall process of merging modes to reduce the total number of modes in accordance with an embodiment. A given circuit configuration can have a large number of modes 110 as shown in FIG. 1. The initial set 130 of modes shown in FIG. 1 comprises modes M1, M2, M3, M4, M5, M6, M7, M8, M9, and M10. The process illustrated in FIG. 1 determines 135 subsets 120 of modes from the set 130 such that modes in each subset 120 can be potentially merged with each other. For example, as shown in FIG. 1, modes M1, M2, and M3 of subset 120a can be merged with each other, modes M4, M5, M6, and M7 of subset 120b can be merged with each other and modes M8, M9, and M10 of subset 120c can be merged with each other. (A letter after a reference numeral, such as "120a," indicates that the text refers specifically to the element having that particular reference numeral, while a reference numeral in the text without a following letter, such as "120," refers to any or all of the elements in the figures bearing that reference numeral.)

The next step merges 145 the modes of each subset 120 so as to obtain a set 140 comprising fewer modes than the original set 130. For example, merged mode MA is obtained by merging 145a modes of subset 120a, merged mode MB is obtained by merging 145b modes of subset 120b, and merged mode MC is obtained by merging 145c modes of subset 120c. Accordingly, the process illustrated in FIG. 1 reduces the total number of modes to be processed for a given circuit configuration. The details of an example process used for determining whether two or more modes can be merged are further described herein.

Figure 2:
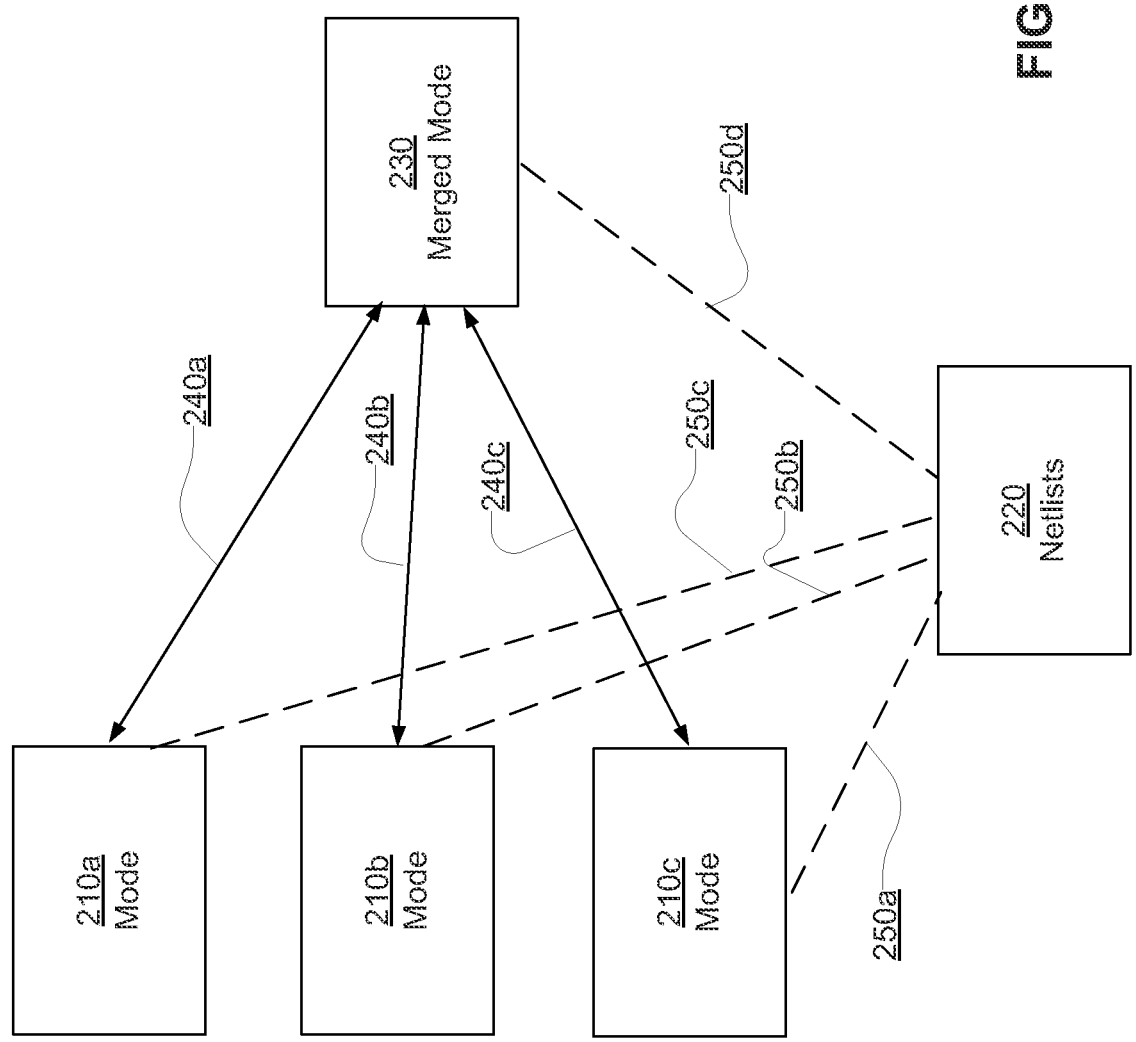
FIG. 2 illustrates merging of multiple modes of a given circuit configuration into a merged mode, in accordance with an embodiment.

FIG. 2 illustrates the step 145 of merging multiple modes of a given circuit configuration into a merged mode, in accordance with an embodiment of the invention. The modes 210 and the merged mode 230 correspond to the set of netlists 220. Each mode 210, 230 represented in FIG. 2 corresponds to a set of constraints corresponding to the netlists 220. The association between the modes and the netlists 220 is represented by the dotted lines 250. The merged mode 230 corresponds to a set of timing constraints that are equivalent to the timing constraints contained in modes 210 as represented by the arrows 140.

System Architecture

Figure 3:
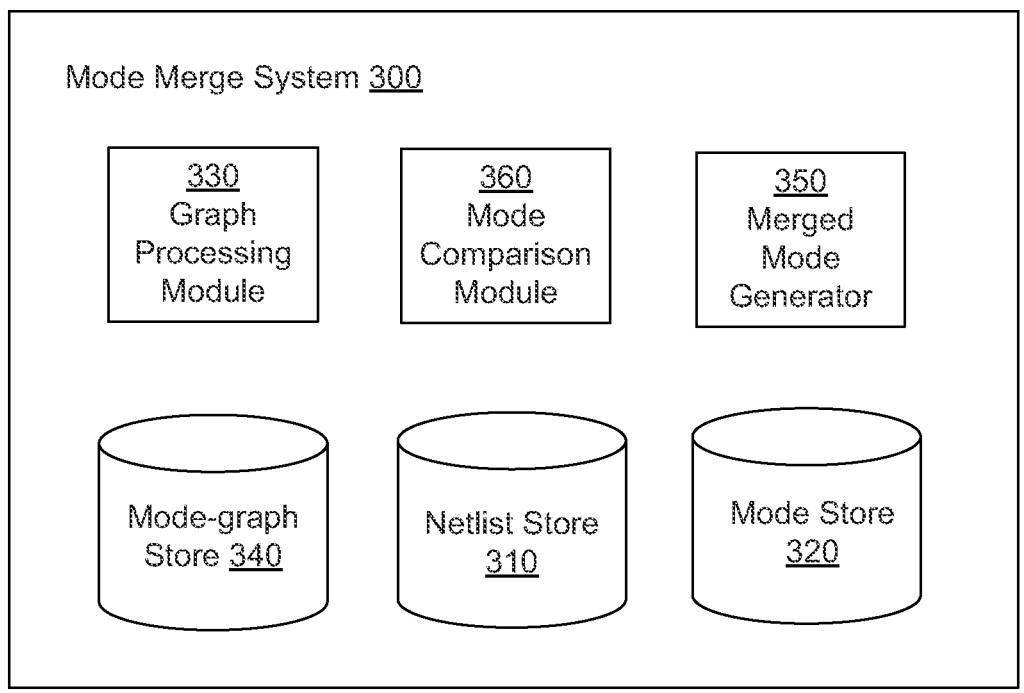
FIG. 3 illustrates an embodiment of the system architecture for automatic reduction of the number of modes by merging modes, in accordance with an embodiment.

FIG. 3 illustrates an embodiment of the system architecture for automatic reduction of modes by merging modes, in accordance with an embodiment. The system architecture illustrated in FIG. 3 shows a mode merge system 300 comprising a graph processing module 330, a merged mode generator 350, a mode comparison module 360, a netlist store 310, a mode-graph store 340, and a mode store 320.

The netlist store 310 stores the netlists of the circuit configuration being analyzed. The mode store 320 stores the information describing the individual modes as well as the merged modes being processed. A representation of a mode comprises information describing constraints of the mode. The mode-graph store 340 stores a graph representation of relationships between modes. An edge between two modes in the mode-graph indicates that the two modes can be merged with each other.

The mode comparison module 360 compares information describing modes to determine whether a pair of modes can be merged. The graph processing module 330 processes the mode-graph to determine subsets of modes that are mergeable. The graph processing nodule 330 determines fully connected sub-graphs of a graph representation of modes to identify subsets of modes that can be merged. The merged mode generator 350 performs automatic generation of a merged mode from a subset of modes determined to be mergeable with each other.

In one embodiment, the mode merge system 300 can be a conventional computer system executing, for example, a Microsoft Windows-compatible operating system (OS), Apple OS X, and/or a Linux distribution. Some embodiments of the mode merge system 300 have different and/or other modules than the ones described herein, and the functions can be distributed among the modules in a different manner than is described here. Conventional components such as network interfaces, security mechanisms, load balancers, failover servers, management and network operations consoles, and the like are not shown so as to not obscure the details of the system.

Merging Modes

Figure 4:
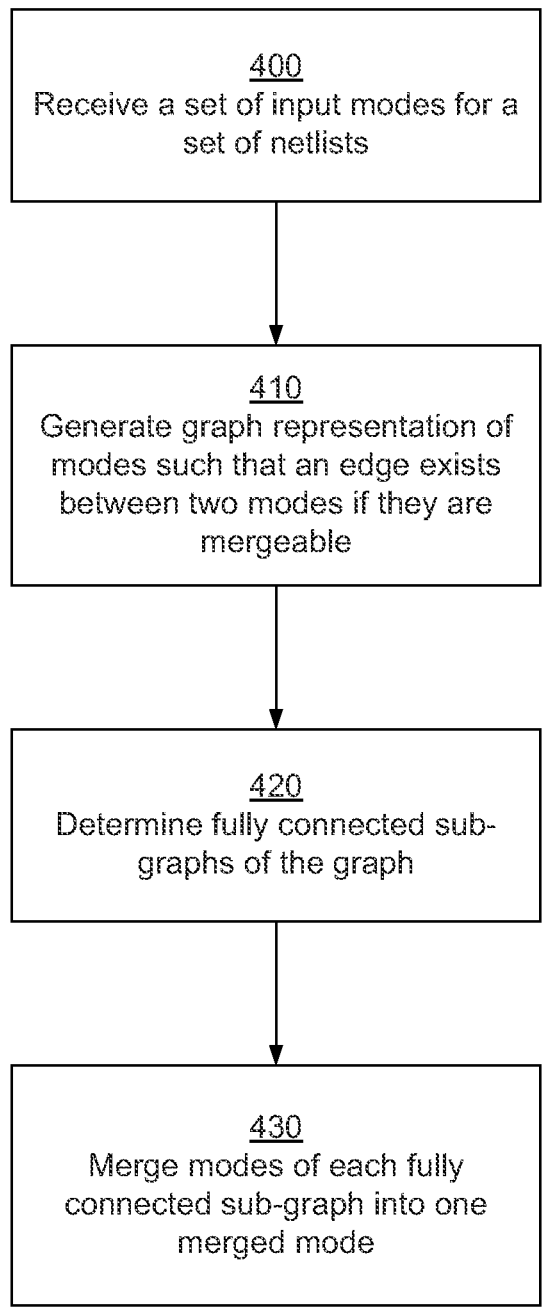
FIG. 4 shows a flowchart illustrating the overall process of merging modes of a circuit configuration in accordance with an embodiment.

FIG. 4 shows a flowchart illustrating the overall process of merging modes of a circuit configuration in accordance with an embodiment. The mode merging system 300 receives 400 a set of modes for a given set of netlists stored in the netlist store 310. The modes may be read from one or more files generated by another software tool, for example, a user interface that allows users to input mode descriptions. The information describing the modes is stored in the mode store 320.

The graph processing module 330 generates 410 a graph representation of the relationships between modes. The graph representation is called a mode-graph and is stored in the mode-graph store 340. Each node of the mode graph represents a mode. The mode-graph includes an edge between two modes if the two modes are mergeable. Alternatively, if two modes cannot be merged together, the generated 410 graph representation does not include a direct edge connecting the two modes. The graph processing module 330 invokes the mode comparison module 360 to determine whether any two modes can be merged with each other.

The graph processing module 330 determines 420 fully connected sub-graphs of the mode-graph. In an embodiment, the fully connected sub-graphs are determined using conventional graph techniques. A fully connected sub-graph of a graph is also called a clique. A maximal clique is a clique that cannot be extended by including adjacent nodes of the graph. The problem of listing all maximal cliques of a graph is known to be NP-complete and known techniques for solving the problem take time exponential in the size of the graph. However, embodiments use heuristics that determine a set of cliques of a graph that may not be maximal cliques for example, greedy heuristics that may not find an optimal solution. Embodiments can also execute techniques that take time exponential in number of modes if the number of modes is small. Even if the cliques determined are not maximal, merging the modes of set of cliques reduces the total number of modes.

The merged mode generator 350 merges the modes belonging to each clique of modes determined 430. Systems and processes for automatic generation of merged modes from a given set of individual modes are disclosed in U.S. application Ser. No. 12/960,745, filed Dec. 6, 2010, which is hereby incorporated by reference in its entirety. As a result of merging modes corresponding to each clique, the total number of modes is reduced to the number of cliques identified. Any further processing based on the modes is more efficient since there are fewer modes to be processed.

Figure 5:
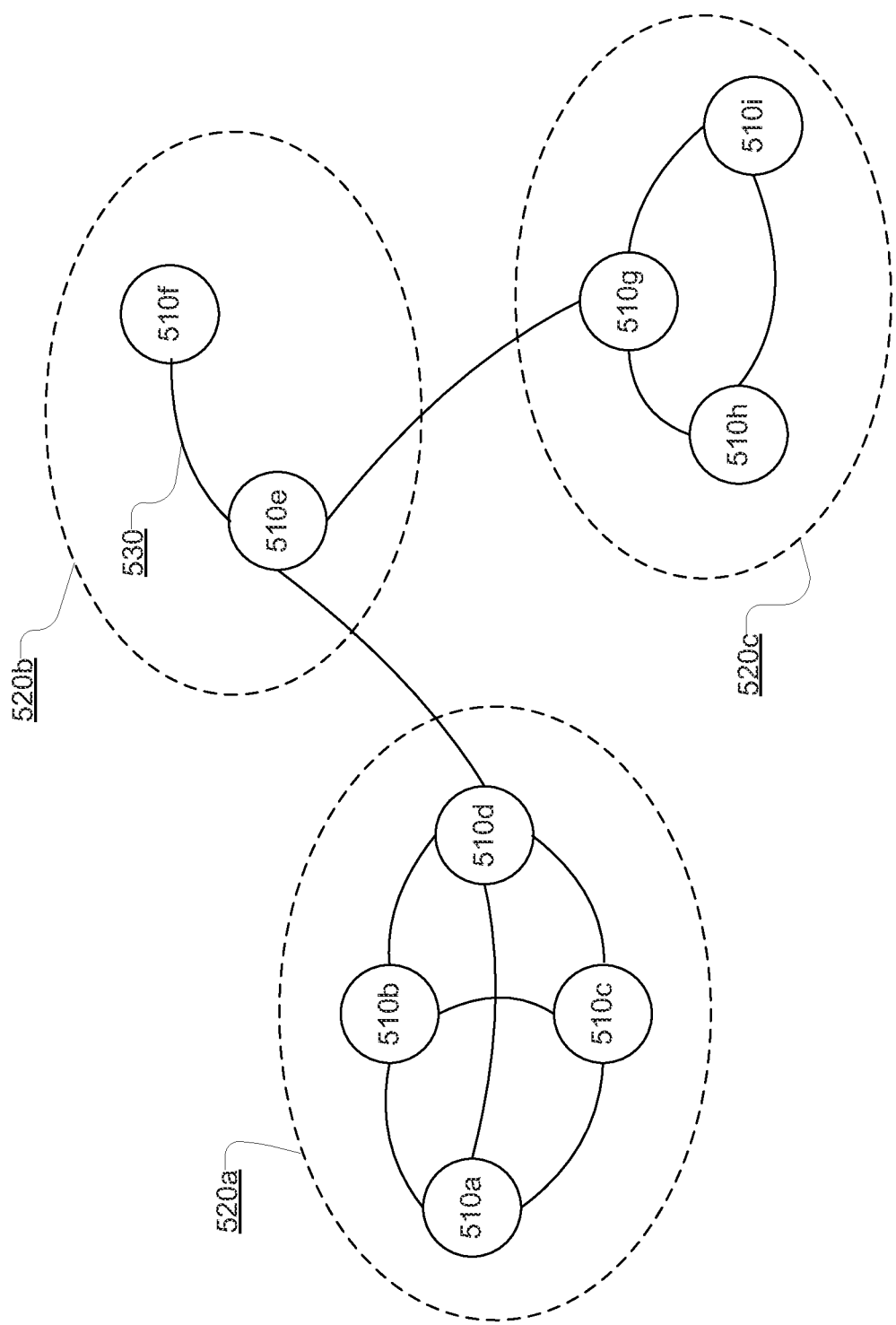
FIG. 5 shows an example mode-graph showing the cliques of the mode-graph in accordance with an embodiment.

FIG. 5 shows an example mode-graph showing the cliques of the mode graph in accordance with an embodiment. Each node of the mode-graph illustrated in the FIG. 5 corresponds to a mode 510. There is an edge 530 between any two modes 510 if the modes are mergeable. For example, the modes 510e and 510f are mergeable as indicated by the edge 530 between them. Although the example illustrated in FIG. 5 shows cliques that are non-overlapping, the techniques described herein for automatic mode merging can be extended to mode graphs where the cliques are overlapping.

The graph shown in FIG. 5 shows three cliques 520a, 520b, and 520c. Each clique includes edges between every pair of modes. For example clique 520b has two modes 510e and 510f that are connected by an edge. Clique 520a includes three modes 510g, 510h, and 510i and there is an edge between each pair of modes (510g, 510h), (510g, 510i), and (510i, 510h). Similarly, clique 520a includes 4 modes 510a, 510b, 510c, and 510d such that each pair of modes within the clique 520a is connected by an edge, indicating that each pair is mergeable.

Determining Mode Mergeability

Figure 6:
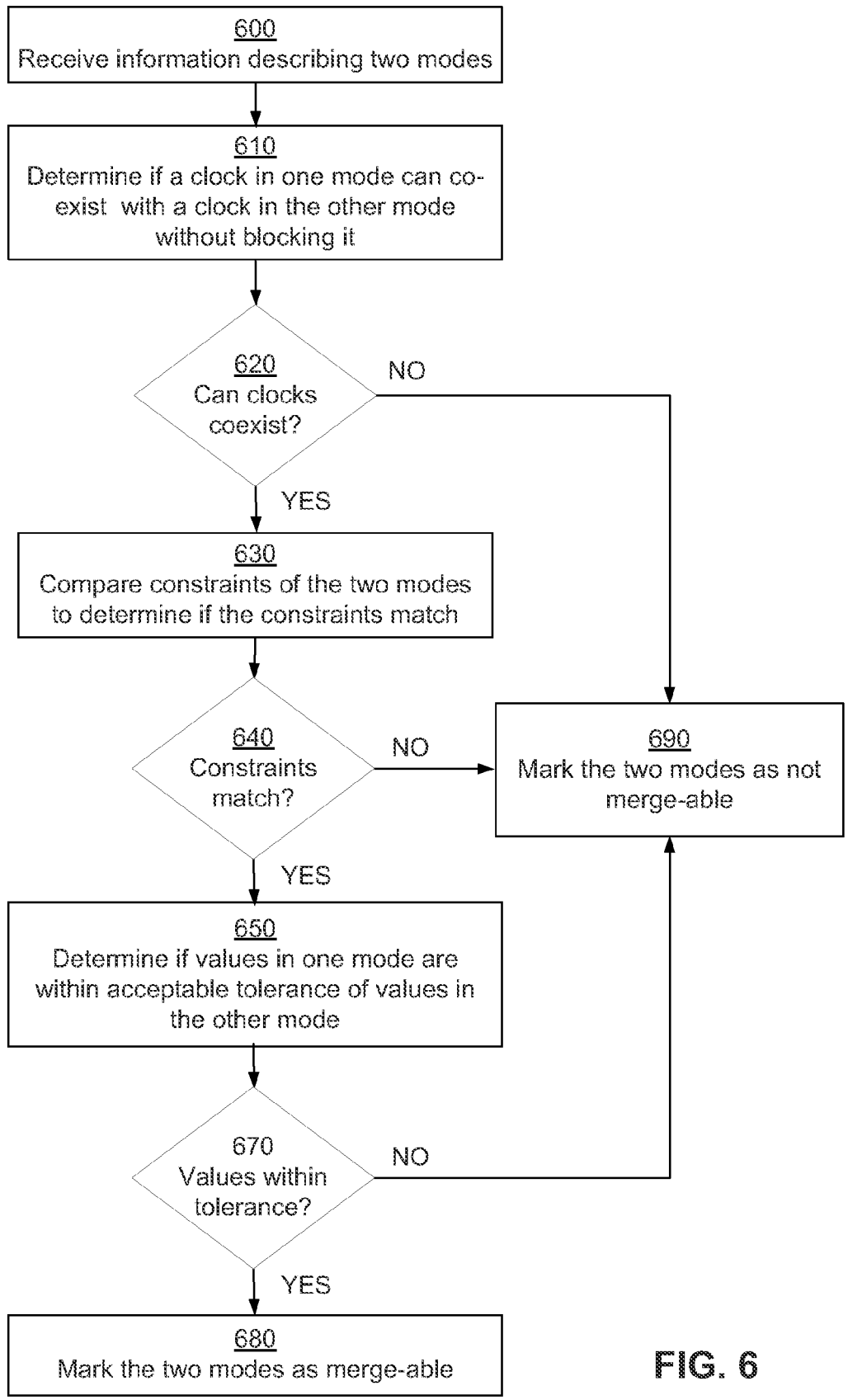
FIG. 6 shows a flowchart for illustrating the process of determining whether two modes are mergeable, in accordance with an embodiment.

FIG. 6 shows a flowchart for illustrating the process of determining whether two modes are mergeable, in accordance with an embodiment. FIGS. 7-10 show further details of various steps within FIG. 6. The mode comparison module 360 receives 600 information describing two modes and determines whether the modes are mergeable or not. Determining whether two modes are mergeable or not comprises following steps.

The mode comparison module 360 determines 610 whether a clock in one mode can co-exist with a clock in the other mode without blocking it. If the mode comparison module 360 determines 620 that clockA in a mode cannot co-exist with clockB in the other mode (e.g., because clockA blocks propagation of clockB), the two modes are considered not mergeable. Therefore, the mode comparison module 360 marks 690 the two modes as not mergeable. If all clocks in one mode can co-exist with clocks in the other mode and similarly all clocks in the other mode can co-exist with the clocks in the first mode, the mode comparison module 360 proceeds with determining whether the modes are mergeable based on following criteria.

The mode comparison module 360 compares 630 constraints from the two modes to determine whether the modes can be merged. Examples of constraints include timing exceptions, including exceptions to set false path, set multicycle paths, set maximum/minimum delay etc. In an embodiment, comparing 630 constraints comprises determining for each constraint in one mode, whether there is a corresponding constraint in the other mode. In an embodiment, the constraints may be transformed to an equivalent constraint to match them, as further described herein. For example, two constraints may not match as specified in the modes but the constraints may be transformed to logically equivalent constraints that match. If all the constraints of one mode match the constraints of the other mode (and vice versa, i.e., all the constraints of the other mode match the constraints of the first mode), the two modes are determined to be mergeable (unless subsequent matching, for example, step 650 determines that the modes are not mergeable).

In some cases, a constraint present in one mode may be absent in the other mode. However, the two modes may be determined to be mergeable if the constraint is effective in the first mode only along paths that are disabled (or inactive) in the other mode or clocked by different clocks in the other mode. The flowchart illustrated in FIG. 10 describes the step 630 in further details.

The mode comparison module 360 determines whether a constraint in a mode can be transformed to another logically equivalent constraint that allows the two modes to be merged.

If a constraint is present in one mode but absent from the other mode and there are no transformations that either allow the constraint to be matched with a constraint in the other mode, the two modes are determined 690 to be not mergeable. For example, even if a constraint from one mode is absent in the other mode, the two modes may be mergeable if the constraint can be transformed to a logically equivalent constraint such that all paths affected by the constraint are either disabled or inactive in the other mode, or are clocked by different clocks at launch or capture.

The mode comparison module 360 further determines 650 if values associated with constraints in each mode match the corresponding values in a corresponding constraint in the other mode. Two values match if they are either same or within a pre-specified tolerance of each other. If certain values associated with constraints in each mode are determined to be outside an acceptable tolerance of the corresponding values in the other mode, the two modes are marked 690 as not mergeable. If values associated with constraints in a mode match the corresponding values in the other mode, the two modes are marked 680 as being mergeable.

The information describing whether the two modes are mergeable may be stored in the mode-graph store 340. Following are examples illustrating the various steps of determining mode mergeability described above.

Using Clock Propagation to Determine Mode Mergeability

Figure 7A:
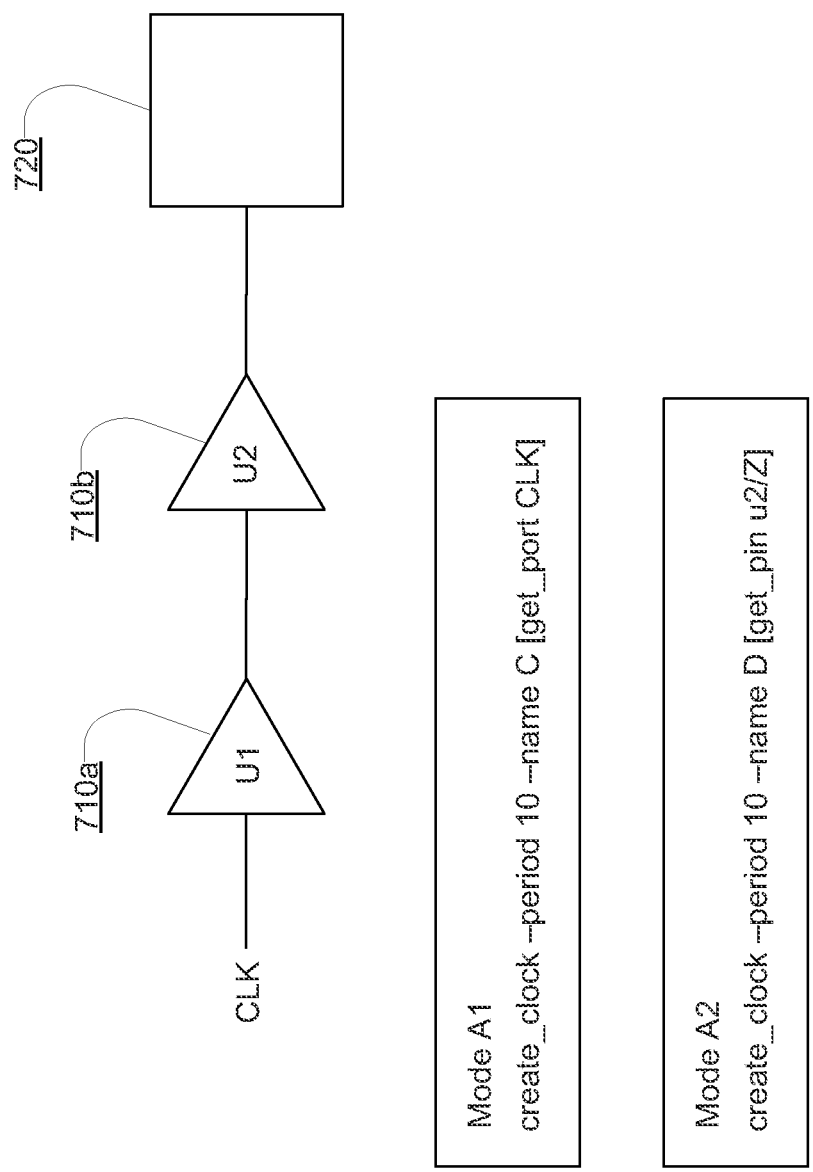
FIG. 7(a-b) show an example circuit illustrating how to determine whether two modes are mergeable based on whether clocks in the two modes can coexist, in accordance with an embodiment.
Figure 7B:
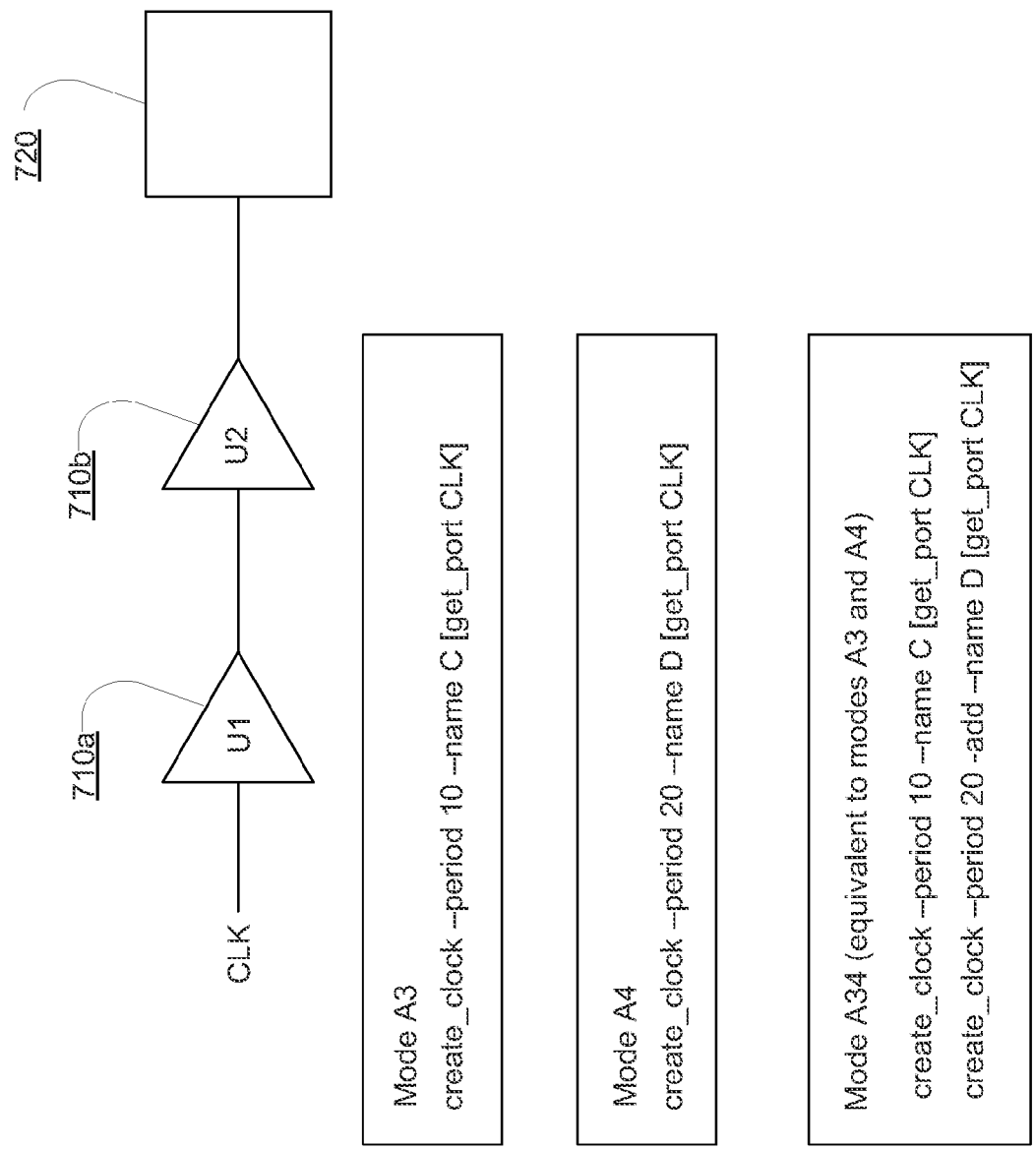

FIG. 7(*a*) shows an example circuit illustrating how to determine whether two modes are mergeable based on whether clocks in the two modes can coexist, in accordance with an embodiment. The circuit illustrated in FIG. 7 comprises logic gates 710*a* (called U1) and 710*b* (called U2), and a flip-flop 720. Assume that mode A1 includes a constraint "create_clock-period 10-name C [get_port CLK]" specifying that clock input named C is provided at the input port CLK. Also assume that mode A2 includes a constraint "create_clock-period 10-name D [get_pin U2/Z]" specifying that a clock input named D is provided at the output of gate U2. In this example, the propagation of the clock specified in mode A1 is blocked by the clock specified in mode A2. Accordingly, modes A1 and A2 are determined to be not mergeable.

As another example based on the same circuit as shown in FIG. 7(*b*), assume a mode A3 includes constraint "create_clock-period 10-name C [get_port CLK]" specifying clock named C at port CLK. Also assume a mode A4 including constraint "create_clock-period 20-name D [get_port CLK]" specifying another clock named D at the port CLK. In this example, both clocks are specified for the port CLK and the propagation of the clock specified in mode A3 is not blocked by the clock in mode A4 (and vice versa). Accordingly, modes A3 and A4 can be merged. For example, a merged mode A34 can be defined that includes constraints, "create_clock-period 10-name C [get_port CLK]" and "create_clock-period 10—add-name D [get_port CLK]." The merged mode A34 is equivalent to the two modes A3 and A4.

Constraint Comparison and Transformation to Determine Mode Mergeability

FIGS. 8(*a-b*) show an example illustrating how constraints may be transformed to allow two modes to be merged, in accordance with an embodiment. Generally, two modes are not mergeable if a constraint occurs in one mode but not the other mode. However, even if a constraint occurs in one mode and not the other mode, the two modes may be mergeable if the constraint is applicable only to a particular path of the first mode and this path is not active in the second mode or clocked by a different clock in the second mode. For example, if the constraint is only applicable to a path p1 of mode X and path p1 is disabled in mode Y or clocked by a different clock, the two modes may be mergeable.

A circuit may use a multiplexer to allow multiple alternate paths, each path associated with one or more modes. The selector input of the multiplexor determines the path that is enabled for a mode. Correspondingly, the paths that are not selected are disabled (or inactive) for that mode. Other logic may be used for enabling/disabling paths in a mode, for example, combinational logic.

A constraint may be applicable to multiple paths in a mode X. If none of the paths to which the constraint is applicable are enabled in mode Y, the two modes are mergeable (subject to matching of other constraints). In some cases, a constraint may be specified in a broad manner in a mode such that it is applicable to more paths than is logically necessary. For example, a constraint C may be applicable to a number of paths in mode X, some of which are disabled in mode X or clocked by different clocks in mode X. However these disabled paths may be enabled in another mode, for example, mode Y in which this constraint C is absent. As a result modes X and Y would be determined to be not mergeable because mode X has the constraint C applied to those certain paths (even though they are disabled in mode X) and mode Y does not. However, constraint C can be transformed to a constraint C' that it is applicable only to paths that are enabled in mode X. The transformed constraint C' is logically equivalent to the original constraint since it applies to all paths to which the original constraint applied that are enabled in the mode X. However, since the constraint C' is not applicable to any path that is enabled in the mode Y, the modes X and Y are mergeable.

As another example, assume that constraint C is specified so that it is applicable to a set of paths S1={p1, p2, p3, p4, p5} in mode X. Of the paths in set S1, paths p4 and p5 are not enabled in mode X. However paths p4 and p5 are enabled in mode Y. In this situation, constraint C can be transformed to constraint C' that it is applicable only to set of paths S2={p1, p2, p3}. Although C is applicable to additional paths, these paths are not enabled in mode X. Therefore, constraints C' and C are equivalent because they are both applicable to same set of paths that are enabled in mode X. Since C' is not applicable to any path that is enabled in mode Y, modes X and Y can be merged even though C' is absent from mode Y.

The circuit configuration illustrated in FIG. 8(*a*) shows two clock inputs CLKA and CLKB, a multiplexor used to select the clock input for a mode, and two flip-flops FF1 and FF2. Assume that the selector input of the multiplexor mux1 is called mux1/S. The mode B1 specifies a constraint "create_clock-name CLKA . . . " to define the clock CLKA. The mode B1 also specifies a constraint "set_case_analysis 0 [mux1/S]" to specify the input value of the multiplexor selector mux1/S as 0, thereby enabling clock CLKA. The mode B1 further specifies a constraint "set_multicycle_path 2—from [FF1/CP]."

FIG. 8(*a*) also shows a mode B2 specifying two constraints, "create_clock-name CLKB . . . " to define the clock CLKB and "set_case_analysis 1 [mux1/S]" to specify the input value of the multiplexor selector mux1/S as 1, thereby enabling clock CLKB. However, mode B2 does not have an equivalent of the "set_multicycle_path" constraint included in mode B1.

An attempt to merge the modes B1 and B2 by combining the constraints from the two modes does not result in a mode that is equivalent to the two modes. For example, the mode B12 shown in FIG. 8(*a*) is not equivalent to the modes B1 and B2. Mode B12 includes the create_clock constraints from the two modes as well as the set_multicycle_path constraint as specified in mode B1. However, mode B12 is not equivalent to mode B2 because it includes an additional constraint that is absent from B2. This additional constraint is the set_multicycle_path constraint along the path including input CLKB and FF1/CP that is active in mode B.

Figure 8A:
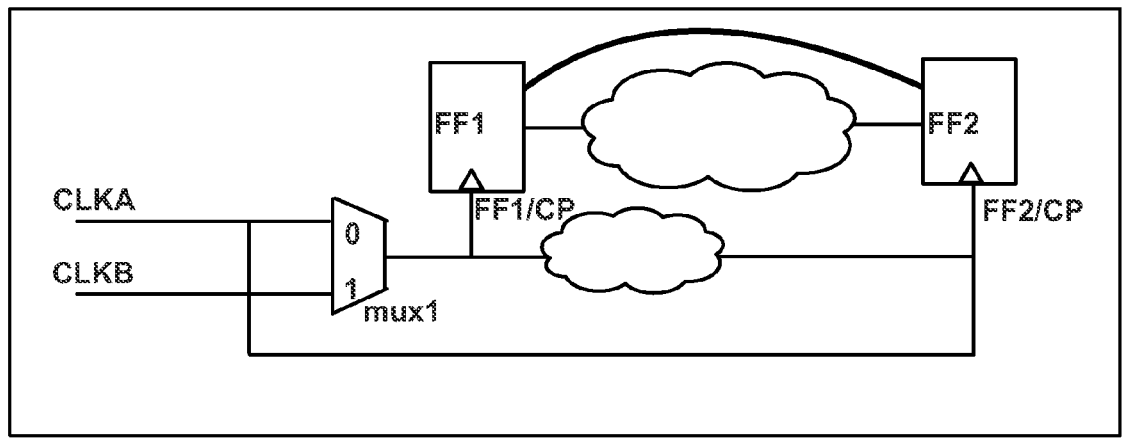
FIGS. 8(a-b) show an example illustrating how constraints may be transformed to allow two modes to be merged, in accordance with an embodiment.
Figure 8B:
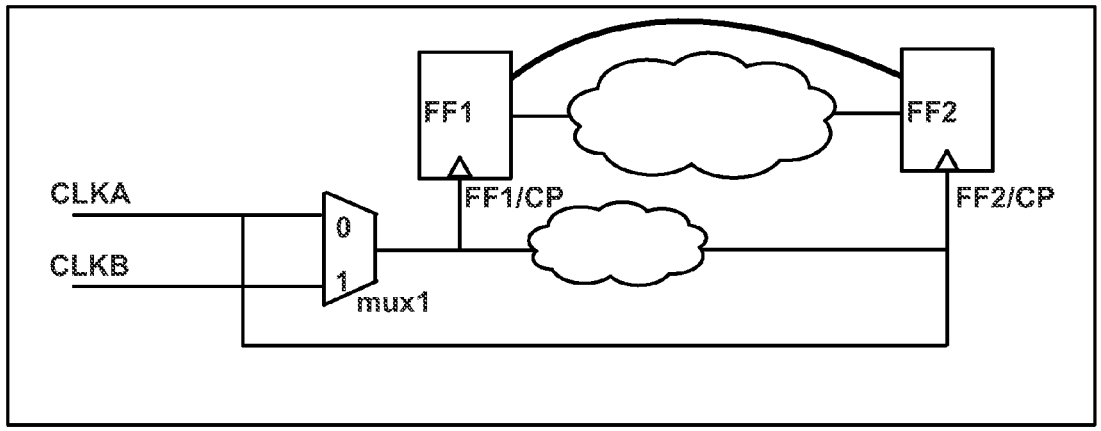

However, FIG. 8(b) illustrates how a constraint may be transformed to another logically equivalent constraint such that the two modes can be merged. In FIG. 8(b) the mode B1 from FIG. 8(a) is replaced by mode B1' since the constraint "set_multicycle_path 2—from [FF1/CP]" (called constraint C1) of mode B1 is replaced by constraint "set_multicycle_path 2—from [get_clocks CLKA]—through [FF1/CP]" (called constraint C1'.) The constraint C1 is applicable to all paths that pass through FF1/CP including paths originating at CLKA and CLKB. In contrast, constraint C1' is applicable only to paths that originate at CLKA and pass through FF1/CP, thereby excluding the path that originates at CLKB. Constraints C1 and C1' are logically equivalent since the path originating in CLKB is not active in mode B1. Accordingly, mode B1' is logically equivalent to mode B1. The modes B1' and B2 are mergeable. For example, merged mode B1'2 including constraints "create_clock-name CLKA . . . ," "create_clock-name CLKB . . . ," and "set_multicycle_path 2—from [get_clocks CLKA]—through [FF1/CP]" is equivalent to modes B1' and B2 and hence it is equivalent to modes B1 and B2.

The example illustrated in FIG. 8 shows how a constraint can be transformed by limiting the source timing nodes of the constraints in order to allow the corresponding modes to be merged. In other situations, the destination timing nodes of a constraint may be limited in order to allow merging of modes. In still other situations, both the source timing nodes as well as the destination timing nodes of a constraint may be limited in order to allow merging of modes. An example of a transformation of constraint C1 above that limits both source and destination is "set_multicycle_path 2—from [get_clocks CLKA]—through [FF1/CP]—to [get_clocks CLKA]." In certain situations, transformation of a constraint may not be possible in order to allow two modes to be merged.

Figure 9:
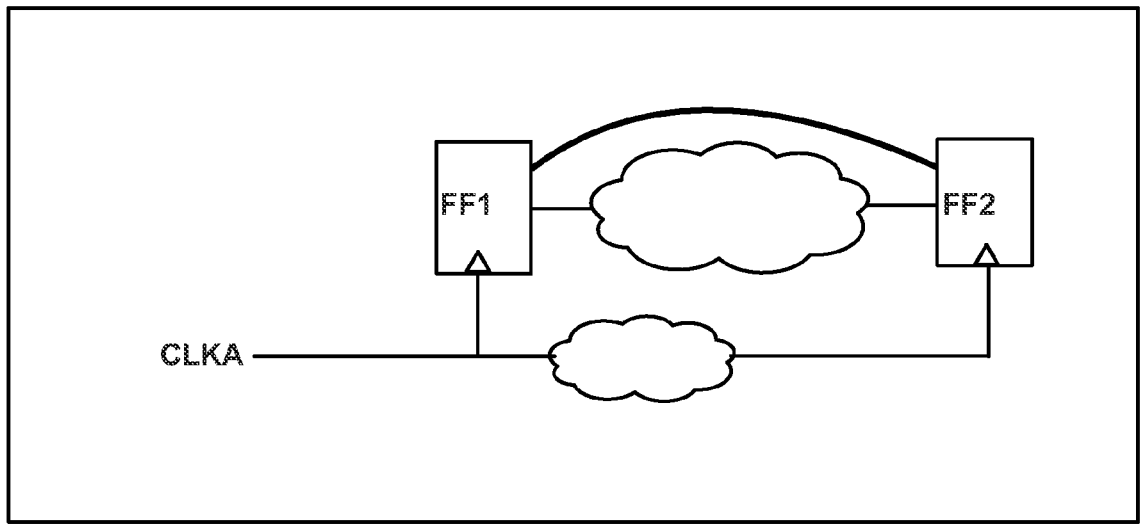
FIG. 9 show an example illustrating that for certain modes, there may be no transformation of constraints that allows the two modes to be merged, in accordance with an embodiment.

FIG. 9 shows an example according to an embodiment illustrating that for certain modes, there may be no transformation of constraints that allows the two modes to be merged. Mode P1 includes constraints "create_clock-name CLKA . . . " and "set_multicycle_path 2—from [FF1/CP]." Mode P2 includes only the constraint "create_clock-name CLKB . . . " In this example, the constraint "set_multicycle_path 2—from [FF1/CP]" is applicable to a path that has CLKA as launch cycle and capture cycle in both modes. Therefore, transforming this constraint to restrict the source and destinations of the constraint does not allow the modes to be merged since in their most restrictive form, the constraint is applicable to paths active in both modes. For example, the constraint may be transformed to "set_multicycle_path 2—from [get_clocks CLKA]—through [FF1/CP]—to [get_clocks CLKA]" that limits both the source and destination of the constraint. However, even in this most restricted form of the constraint, the constraint is applicable to the path with launch clock and capture clock both CLKA which is enabled in both modes P1 and P2. Accordingly, the mode P12 illustrated in FIG. 9 is not equivalent of mode P2 since it introduces an additional constraint in the mode. Therefore, modes P1 and P2 are determined as not mergeable.

Figure 10:
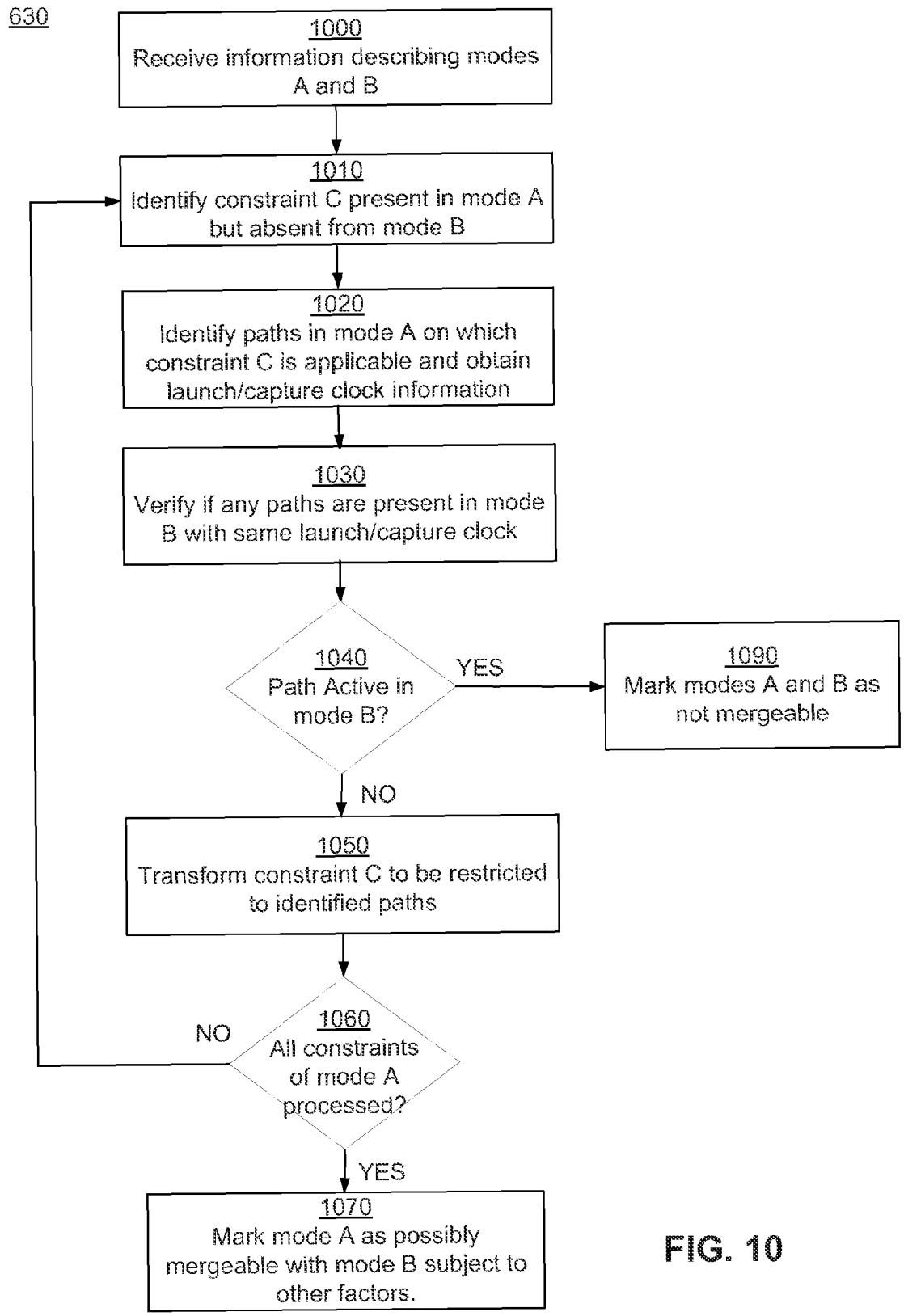
FIG. 10 shows a flowchart of the process illustrating how constraints of two modes are compared to determine if the two modes can be merged and how constraints may be transformed in order to allow modes to be merged, in accordance with an embodiment.

FIG. 10 shows a flowchart of an example process illustrating how constraints of two modes are compared 630 to determine if the two modes can be merged and how constraints may be transformed in order to allow modes to be merged, in accordance with an embodiment. FIG. 10 shows the comparison of constraints in mode A to those in mode B, but the same process is also applied with respect to constraints in mode B versus those in mode A. The mode comparison module 360 receives 1000 information describing two modes, for example, modes A and B. The mode comparison module 360 identifies 1010 constraints present in one mode that are absent in the other mode, for example, constraint C that is present in mode A but absent in mode B. The mode comparison module 360 identifies 1020 paths in mode A on which the constraint C is applicable and obtains launch/capture clock information for these paths. The mode comparison module 360 verifies 1030 if any path identified as a path along which constraint C is applicable is also active in mode B (i.e., has the same launch/capture clock in mode B.) If the mode comparison module 360 determines 1040 that there is at least one path that is enabled in mode B along which constraint C is applicable in mode B, the mode comparison module 360 marks 1090 modes A and B as not mergeable.

If none of the identified paths along which the constraint C is applicable in mode A are enabled or clocked by different clocks in mode B, the constraint C is transformed 1050 so as to limit the constraint to the identified paths. The constraint may be limited to any number of paths that are not enabled in mode B. If the mode comparison module 360 identifies 1060 more constraints to be processed, it repeats the steps 1010, 1020, 1030, 1040, and 1050 for these constraints. If all constraints are processed, the mode comparison module 360 marks the modes A and B as possibly mergeable subject to other attributes of the modes matching as described in the flowchart of FIG. 6.

Value Comparison to Determine Mode Mergeability

Figure 11:
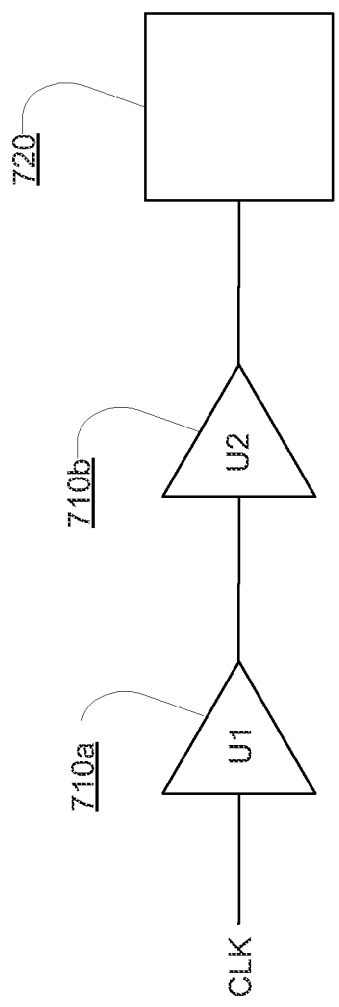
FIG. 11 shows an example illustrating how to determine whether two modes are mergeable based on comparison of values associated with constraints, in accordance with an embodiment.

FIG. 11 shows an example illustrating how to determine 650 whether two modes are mergeable based on comparison of values associated with constraints, in accordance with an embodiment. The circuit configuration illustrated in FIG. 11 is same as the circuit configuration shown in FIG. 7. FIG. 11 shows two modes Q1 and Q2. Assume that mode Q1 includes constraints "create_clock-period 10-name C [get_port CLK]" and "set_clock_latency—source 2.0 [get_clock CLK]." The "set_clock_latency" constraint of mode Q1 specifies a value 2.0 corresponding to the latency of the clock named "C" defined by the "create_clock" constraint. The clock latency models the time it takes the clock signal to propagate from the clock source to the clock capture point. The mode Q2 shown in FIG. 11 includes constraints "create_clock-period 10-name D [get_port CLK]" and "set_clock_latency—source 2.2 [get_clock D]." The "set_clock_latency" constraint of mode Q2 specifies a value 2.2 corresponding to the latency of the clock named "D" defined by the "create_clock" constraint.

In this example, whether the modes Q1 and Q2 can be merged depends on the acceptable tolerance specified for the modes. For example, if the acceptable tolerance for the modes is 5%, the modes Q1 and Q2 are not mergeable since the clock latency for mode Q1 differs from the clock latency for mode Q2 by 10% which is outside the specified tolerance of 5%. However, if the specified tolerance value is 20% the two modes Q1 and Q2 may be merged. For example, a merged mode Q12 may include constraints "create_clock-period 10-name C [get_port CLK]", "set_clock_latency—source—min 2.0 [get_clock CLK]" and "set_clock_latency—source—max 2.2 [get_clock CLK]." The merged mode Q12 specifies the minimum clock latency for CLK to be 2.0 and the maximum latency to be 2.2 which is within the specified tolerance of 20%. Accordingly modes Q1 and Q2 can be merged into mode Q12.

Examples of other constraints that specify values include "set_input_delay," "set_output_delay," "set_clock_uncertainty," "set_clock_transition," and so on. The mode comparison module 360 compares these constraints that specify values to make sure that corresponding constraints in two modes are within a specified tolerance to determine whether the two modes are mergeable.

Computer Architecture

Figure 12:
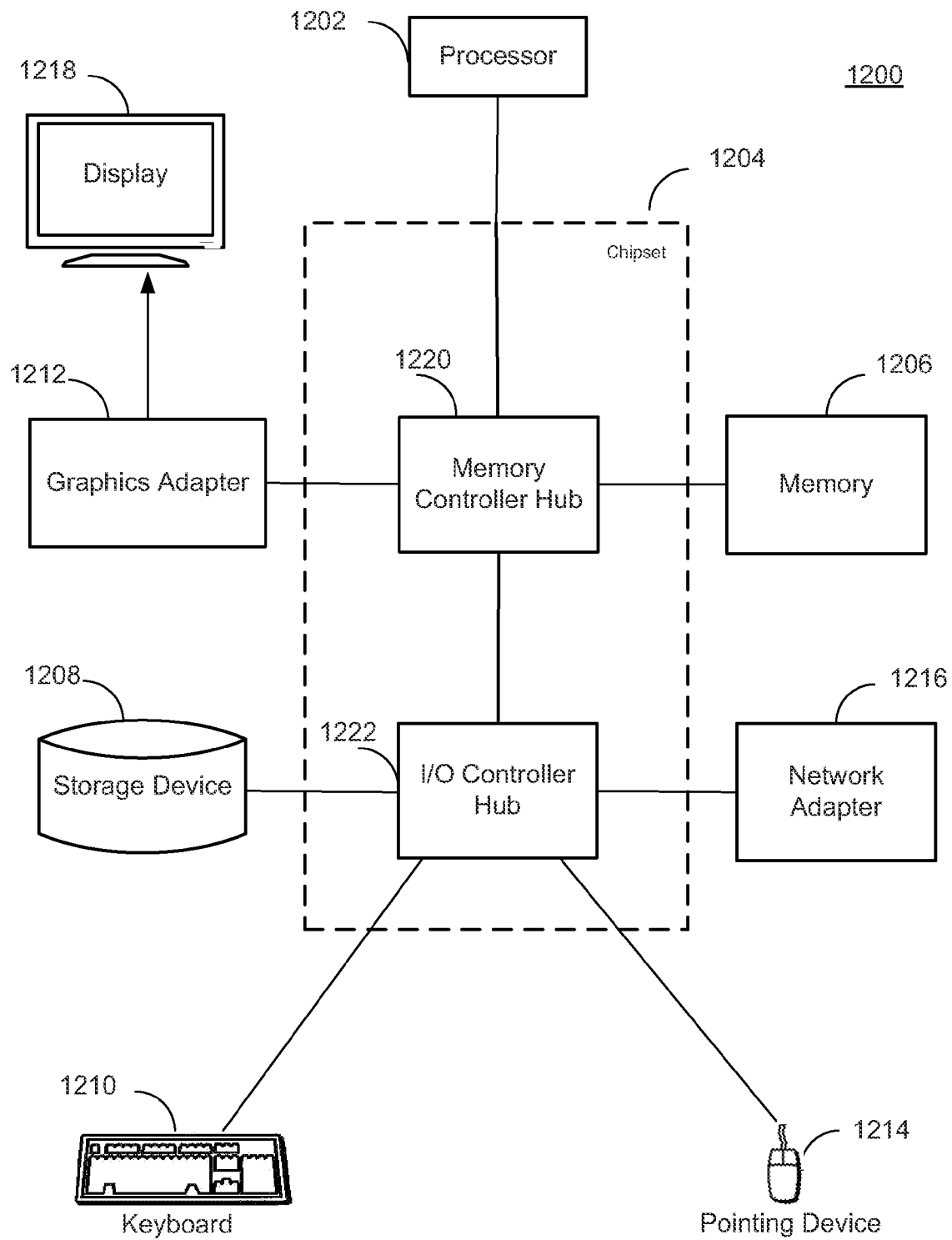
FIG. 12 is a high-level block diagram illustrating an example of a computer for use in determining whether modes of a circuit can be merged, in accordance with an embodiment.

FIG. 12 is a high-level block diagram illustrating an example computer 1200 that can be used for processing the steps of the processes described herein. The computer 1200 includes at least one processor 1202 coupled to a chipset 1204. The chipset 1204 includes a memory controller hub 1220 and an input/output (I/O) controller hub 1222. A memory 1206 and a graphics adapter 1212 are coupled to the memory controller hub 1220, and a display 1218 is coupled to the graphics adapter 1212. A storage device 1208, keyboard 1210, pointing device 1214, and network adapter 1216 are coupled to the I/O controller hub 1222. Other embodiments of the computer 1200 have different architectures.

The storage device 1208 is a non-transitory computer-readable storage medium such as a hard drive, compact disk read-only memory (CD-ROM), DVD, or a solid-state memory device. The memory 1206 holds instructions and data used by the processor 1202. The pointing device 1214 is a mouse, track ball, or other type of pointing device, and is used in combination with the keyboard 1210 to input data into the computer system 1200. The graphics adapter 1212 displays images and other information on the display 1218. The network adapter 1216 couples the computer system 1200 to one or more computer networks.

The computer 1200 is adapted to execute computer program modules for providing functionality described herein. As used herein, the term "module" refers to computer program logic used to provide the specified functionality. Thus, a module can be implemented in hardware, firmware, and/or software. In one embodiment, program modules are stored on the storage device 1208, loaded into the memory 1206, and executed by the processor 1202. The types of computers 1200 used can vary depending upon the embodiment and requirements. For example, a computer may lack displays, keyboards, and/or other devices shown in FIG. 12.

Some portions of above description describe the embodiments in terms of algorithmic processes or operations. These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality. The described operations and their associated modules may be embodied in software, firmware, hardware, or any combinations thereof.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a system and a process for comparing timing constraints of circuits. Thus, while particular embodiments and applications have been illustrated and described, it is to be understood that the present invention is not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A computer-implemented method for identifying modes from a plurality of modes of a circuit that can be merged, the method comprising:
 receiving information describing a plurality of modes of a circuit, the information describing each mode comprising constraints, each constraint applicable to one or more paths;
 determining whether pairs of modes from the plurality of modes are mergeable, comprising:
  selecting a pair of modes comprising a first mode and a second mode;
  selecting a first constraint from the first mode, the first constraint applicable to a first set of paths;
  comparing the selected first constraint to constraints in the second mode to find a corresponding constraint, the corresponding constraint applicable to a second set of paths;
  transforming the selected first constraint such that the transformed constraint is applicable to a subset of paths of the first set of paths, the subset of paths of the first set of paths excluding at least one path of the second set of paths; and
  determining that the pair of modes is mergeable responsive to the transforming;

identifying a subset of modes from the plurality of modes, such that every pair of modes in the subset is determined to be mergeable; and storing, in a non-transitory computer storage device, information indicating that modes from the subset of modes can be merged into a merged mode such that static timing analysis of the merged mode is equivalent to static timing analysis of the subset of modes.

2. The computer-implemented method of claim 1, wherein determining whether a pair of modes from the plurality of modes is mergeable further comprises:

determining that the pair of modes is mergeable responsive to determining that the selected constraint is applicable to the same paths in a merged mode and the first mode but is not applicable to corresponding paths from the second mode.

3. The computer-implemented method of claim 1, wherein transforming the selected constraint comprises:

specifying in the constraint, at least one of a source or destination of a path of the constraint.

4. The computer-implemented method of claim 1, wherein the first mode and the second mode of the pair are determined to be mergeable responsive to determining that each constraint from the first mode satisfies one of:

the constraint matches a constraint in the second mode, or every path along which the constraint is applicable in the first mode is inactive in the second mode or has a clock different from a clock of the path in the first mode.

5. The computer-implemented method of claim 1, wherein determining whether a pair of modes from the plurality of modes is mergeable further comprises:

determining that the first mode and the second mode of the pair are not mergeable responsive to:

determining that there is no constraint in the second mode corresponding to a particular constraint from the first mode, or determining that the particular constraint fails to match any constraint from the second mode and is applicable in the first mode to a path that is active in the second mode.

6. The computer-implemented method of claim 1, wherein a path is inactive in a mode if the path passes through a multiplexor via an input that is not selected in the mode.

7. The computer-implemented method of claim 1, wherein determining whether a pair of modes from the plurality of modes is mergeable further comprises:

determining whether a clock specified in the first mode blocks propagation of a clock specified in the second mode.

8. The computer-implemented method of claim 1, wherein determining whether a pair of modes from the plurality of modes is mergeable further comprises:

determining that the first mode and the second mode are not mergeable responsive to determining that a clock specified in the first mode blocks propagation of a clock specified in the second mode.

9. The computer-implemented method of claim 1, wherein the first mode and the second mode are determined to be mergeable responsive to determining that every clock of the first mode can coexist with clocks of the second mode without blocking propagation of clocks of the second mode.

10. The computer-implemented method of claim 1, wherein determining whether a pair of modes from the plurality of modes is mergeable further comprises:

determining whether a value specified in a constraint of the first mode is within a pre-specified tolerance of a value in a corresponding claim in the second mode.

11. The computer-implemented method of claim 1, wherein determining whether a pair of modes from the plurality of modes is mergeable further comprises:

determining that the first mode and the second mode are not mergeable responsive to determining that a value specified in a constraint of the first mode is within a pre-specified tolerance of a value in a corresponding claim in the second mode.

12. The computer-implemented method of claim 1, further comprising:

determining the first mode and the second mode to be mergeable responsive to determining that values specified in constraints of the first mode are within a pre-specified tolerance of values of corresponding constraints of the second mode.

13. A computer-implemented method for generating merged mode corresponding to a plurality of individual modes for a circuit, the method comprising:

receiving information describing a plurality of modes of a circuit, the information describing each mode comprising constraints;

receiving request to identify modes from the plurality of modes that can be merged into a merged mode such that static timing analysis of the merged mode is equivalent to static timing analysis of the identified modes;

determining whether pairs of modes from the plurality of modes are mergeable, comprising:

selecting a pair of modes comprising a first mode and a second mode;

selecting a first constraint from the first mode, the first constraint applicable to a first set of paths;

comparing the selected first constraint to constraints in the second mode to find a corresponding constraint, the corresponding constraint applicable to a second set of paths;

transforming the selected first constraint such that the transformed constraint is applicable to a subset of paths of the first set of paths, the subset of paths of the first set of paths excluding at least one path of the second set of paths;

determining whether a value specified in a constraint of the first mode is within a pre-specified tolerance of a value in a corresponding claim in the second mode;

determining that the first mode and the second mode of the pair are mergeable responsive to:

determining that each constraint from the first mode either matches a constraint in the second mode or fails to match from the second mode but is applicable to paths that are inactive in the second mode;

determining that no clock specified in the first mode blocks propagation of any clock specified in the second mode;

determining that each value specified in a constraint of the first mode is within a pre-specified tolerance of a corresponding value in a corresponding claim in the second mode; and identifying a subset of modes from the plurality of modes, such that every pair of modes in the subset is determined to be mergeable; and storing, in a non-transitory computer storage device, information indicating that modes from the subset of modes can be merged into a merged mode such that static timing analysis of the merged mode is equivalent to static timing analysis of the subset of modes.

14. A computer-implemented system for merging modes, the system comprising:
a computer processor; and
a non-transitory computer-readable storage medium storing computer program modules configured to execute on the computer processor, the computer program modules configured to cause the processor to:
receive information describing a plurality of modes of a circuit, the information describing each mode comprising constraints;
receive request to identify modes from the plurality of modes that can be merged into a merged mode such that static timing analysis of the merged mode is equivalent to static timing analysis of the identified modes;
determine whether pairs of modes from the plurality of modes are mergeable, the determining causing the processor to:
select a pair or modes comprising a first mode and a second mode;
select a first constraint from the first mode, the first constraint applicable to a first set of paths;
comparing the selected first constraint to constraints in the second mode to find a corresponding constraint, the corresponding constraint applicable to a second set of paths;
transform the selected first constraint such that the transformed constraint is applicable to a subset of paths of the first set of paths, the subset of paths of the first set of paths excluding at least one path of the second set of paths; and
determine that the pair of modes is mergeable responsive to the transforming;
identify a subset of modes from the plurality of modes, such that every pair of modes in the subset is determined to be mergeable; and
store information indicating that modes from the subset of modes can be merged into a merged mode such that static timing analysis of the merged mode is equivalent to static timing analysis of the subset of modes.

15. The computer-implemented system of claim 14, wherein determining whether a pair of modes from the plurality of modes is mergeable further causes the processor to:
determine that the pair of modes is mergeable responsive to determining that the selected constraint is applicable to the same paths in a merged mode and the first mode but is not applicable to corresponding paths from the second mode.

16. The computer-implemented system of claim 14, wherein determining whether a pair of modes from the plurality of modes is mergeable further causes the processor to:
determine whether a clock specified in the first mode blocks propagation of a clock specified in the second mode.

17. The computer-implemented system of claim 14, wherein determining whether a pair of modes from the plurality of modes is mergeable further causes the processor to:
determine whether a value specified in a constraint of the first mode is within a pre-specified tolerance of a value in a corresponding claim in the second mode.

18. A non-transitory computer readable storage medium storing a computer program product including computer instructions configured to cause a processor of a computer to:
receive information describing a plurality of modes of a circuit, the information describing each mode comprising constraints;
receive request to identify modes from the plurality of modes that can be merged into a merged mode such that static timing analysis of the merged mode is equivalent to static timing analysis of the identified modes;
determine whether pairs of modes from the plurality of modes are mergeable, each pair comprising a first mode and a second mode, the determining causing the processor to:
select a pair or modes comprising a first mode and a second mode;
select a first constraint from the first mode, the first constraint applicable to a first set of paths;
comparing the selected first constraint to constraints in the second mode to find a corresponding constraint, the corresponding constraint applicable to a second set of paths;
transform the selected first constraint such that the transformed constraint is applicable to a subset of paths of the first set of paths, the subset of paths of the first set of paths excluding at least one path of the second set of paths; and
determine that the pair of modes is mergeable responsive to the transforming;
identify a subset of modes from the plurality of modes, such that every pair of modes in the subset is determined to be mergeable; and
store, in a non-transitory computer storage device, information indicating that modes from the subset of modes can be merged into a merged mode such that static timing analysis of the merged mode is equivalent to static timing analysis of the subset of modes.

19. The non-transitory computer readable storage medium of claim 18, wherein determining whether a pair of modes from the plurality of modes is mergeable further causes the processor to:
determine that the pair of modes is mergeable responsive to determining that the selected constraint is applicable to the same paths in a merged mode and the first mode but is not applicable to corresponding paths from the second mode.

20. The non-transitory computer readable storage medium of claim 18, wherein determining whether a pair of modes from the plurality of modes is mergeable further causes the processor to:
determine whether a clock specified in the first mode blocks propagation of a clock specified in the second mode.

21. The non-transitory computer readable storage medium of claim 18, wherein determining whether a pair of modes from the plurality of modes is mergeable further causes the processor to:
determine whether a value specified in a constraint of the first mode is within a pre-specified tolerance of a value in a corresponding claim in the second mode.

22. A computer-implemented method for automatically reducing the number of modes of a circuit for timing analysis, the method comprising:
receiving information describing a plurality of modes of a circuit, the information describing each mode comprising constraints;
receiving request to identify modes from the plurality of modes that can be merged into a merged mode such that static timing analysis of the merged mode is equivalent to static timing analysis of the identified modes;

determining whether pairs of modes from the plurality of modes are mergeable based on comparison of constraints of the mode, each pair comprising a first mode and a second mode;

selecting a pair of modes comprising a first mode and a second mode;

selecting a first constraint from the first mode, the first constraint applicable to a first set of paths;

comparing the selected first constraint to constraints in the second mode to find a corresponding constraint, the corresponding constraint applicable to a second set of paths;

transforming the selected first constraint such that the transformed constraint is applicable to a subset of paths of the first constrain, the subset of paths of the first set of paths excluding at least one path of the second set of paths;

identifying a subset of modes from the plurality of modes, such that every pair of modes in the subset is determined to be mergeable; and storing, in a non-transitory computer storage device, information indicating that modes from the subset of modes can be merged.

23. The computer-implemented method of claim 22, wherein determining whether pairs of modes from the plurality of modes are mergeable comprises:

for each mode in a pair of modes, determining whether constraints for the mode have corresponding constraints in the other mode.

24. The computer-implemented method of claim 23, wherein for each mode in a pair of modes, determining whether the constraints for the mode have corresponding constraints in the other mode further comprises:

transforming a constraint to an equivalent constraint applicable to the same paths in a merged mode and the first mode but does not include any constrained paths from second mode.

* * * * *

UNITED STATES PATENT AND TRADEMARK OFFICE
CERTIFICATE OF CORRECTION

PATENT NO.         : 8,701,074 B2
APPLICATION NO.    : 13/328572
DATED              : April 15, 2014
INVENTOR(S)        : Subramanyam Sripada and Cho Moon Page 1 of 1

It is certified that error appears in the above-identified patent and that said Letters Patent is hereby corrected as shown below:

In the Claims

Column 17, line 14, after "of the first", delete "constrain" and insert --constraint--

Signed and Sealed this
Twenty-first Day of April, 2015

Michelle K. Lee
*Director of the United States Patent and Trademark Office*